(12) United States Patent
Kouketsu et al.

(10) Patent No.: US 9,234,595 B2
(45) Date of Patent: *Jan. 12, 2016

(54) VACUUM CONTROL VALVE AND VACUUM CONTROL APPARATUS

(71) Applicant: CKD CORPORATION, Komaki-shi, Aichi (JP)

(72) Inventors: Masayuki Kouketsu, Komaki (JP); Hiroshi Itafuji, Komaki (JP)

(73) Assignee: CKD CORPORATION, Komaki-Shi, Aichi (JP)

( * ) Notice: Subject to any disclaimer, the term of this patent is extended or adjusted under 35 U.S.C. 154(b) by 271 days.

This patent is subject to a terminal disclaimer.

(21) Appl. No.: 13/957,299

(22) Filed: Aug. 1, 2013

(65) Prior Publication Data

US 2013/0313458 A1    Nov. 28, 2013

Related U.S. Application Data

(63) Continuation of application No. PCT/JP2011/076756, filed on Nov. 21, 2011.

(30) Foreign Application Priority Data

Feb. 2, 2011   (JP) ................. 2011-020586

(51) Int. Cl.
  *F16K 31/00*   (2006.01)
  *F16K 31/02*   (2006.01)
  (Continued)

(52) U.S. Cl.
  CPC .............. *F16K 3/06* (2013.01); *F16K 31/1262* (2013.01); *F16K 51/02* (2013.01); *F16J 1/01* (2013.01); *H01L 21/67017* (2013.01)

(58) Field of Classification Search
  CPC ................ F16J 1/01; F16K 51/02; F16K 3/06
  USPC ........................................................ 251/63.5
  See application file for complete search history.

(56) References Cited

U.S. PATENT DOCUMENTS 5,178,366 A   1/1993   Kojima et al.
7,328,881 B2  2/2008   Sakurai et al.
(Continued)

FOREIGN PATENT DOCUMENTS

JP   61-119874   6/1986
JP   5-118447    5/1993
(Continued)

OTHER PUBLICATIONS

Search Report in International Application No. PCT/JP2013/055545 dated Apr. 9, 2013.
(Continued)

*Primary Examiner* — John K Fristoe, Jr.
*Assistant Examiner* — Kelsey Rohman
(74) *Attorney, Agent, or Firm* — Beyer Law Group LLP (57) ABSTRACT

A vacuum control valve connected between a vacuum chamber and a vacuum pump includes a control valve main body having a valve seat formed in a vacuum flow passage, a valve body that manipulates the valve opening by performing a linear motion to adjust a lift, a rod that transmits driving force from a linear driving unit that generates the driving force, a sliding/sealing member that seals the vacuum flow passage while allowing the rod to slide, and a cylindrical member that covers a sliding range of the rod. The sliding range includes a range movable from a valve body flow passage side to an exterior side. The cylindrical member has an outer peripheral surface, a working fluid absorption amount per unit area of the outer peripheral surface being smaller than that of an outer surface of the rod.

13 Claims, 6 Drawing Sheets

(51) Int. Cl.
- *F16K 3/06* (2006.01)
- *F16K 31/126* (2006.01)
- *F16K 51/02* (2006.01)
- *F16J 1/01* (2006.01)
- *H01L 21/67* (2006.01)

(56) References Cited

U.S. PATENT DOCUMENTS

| | | | |
|---|---|---|---|
| 8,210,196 B2* | 7/2012 | Itafuji et al. | 137/114 |
| 2006/0169940 A1 | 8/2006 | Mayer et al. | |
| 2008/0173842 A1* | 7/2008 | Sakurai | 251/335.3 |

FOREIGN PATENT DOCUMENTS

| | | |
|---|---|---|
| JP | 5-23841 U | 6/1993 |
| JP | 6-101782 | 4/1994 |
| JP | 2000-130635 | 5/2000 |
| JP | 2001-200346 | 7/2001 |
| JP | 2003-42339 | 2/2003 |
| JP | 2005-30459 | 2/2005 |
| JP | 2008-95777 | 4/2008 |
| JP | 2009-68607 | 4/2009 |

OTHER PUBLICATIONS

U.S. Appl. No. 14/519,426, filed Oct. 21, 2014.
Office Action dated Jun. 10, 2015 for U.S. Appl. No. 14/519,426.

* cited by examiner

VACUUM CONTROL VALVE AND VACUUM CONTROL APPARATUS

CLAIM OF PRIORITY

This application is a Continuation of International Patent Application No. PCT/JP2011/076756, filed on Nov. 21, 2011, which claims priority to Japanese Patent Application No. 2011-020586, filed on Feb. 2, 2011, each of which is hereby incorporated by reference.

BACKGROUND OF THE INVENTION

1. Field of the Invention

The present invention relates to a vacuum control valve that controls a flow of a gas through a vacuum chamber employed in a vacuum apparatus that uses plasma.

2. Description of the Related Art

Manufacture of a semiconductor device includes a process that uses plasma, such as plasma etching, for example. In the plasma etching process, a vacuum pressure in a vacuum chamber is controlled while introducing etching gas through a vacuum control valve. The vacuum pressure control is performed by manipulating a conductance of the vacuum control valve. In a pendulum type vacuum control valve used widely in plasma etching, conductance manipulation is performed by operating a pendulum-type valve body so as to adjust a valve opening, for example, as described in Japanese Patent Application Publication No. 2009-117444. With a method of adjusting the valve opening by operating a pendulum-type valve body, however, controllability is poor in a low flow rate region (a low conductance region), making it impossible to respond to a reduced etching gas flow rate.

A poppet type vacuum control valve, which is capable of responding to a reduced etching gas flow rate, may also be used to control the vacuum pressure. A poppet system is a system of adjusting the conductance by manipulating a distance between the valve body and a valve seat (i.e. a lift) in accordance with a linear motion of a piston, for example, as described in Japanese Patent Application Publication Nos. 2010-276096 and 2003-194257. However, a metallic bellows of a poppet type vacuum control valve is not plasma-resistant, and therefore a poppet type vacuum control valve cannot be employed in a vacuum chamber that uses plasma. The metallic bellows is a constituent component used to seal a sliding part, which is required for the linear motion of the piston, to maintain a degree of vacuum, for example, as described in Japanese Patent Application Publication Nos. 2000-130635 and H3-260072.

BRIEF DESCRIPTION OF THE INVENTION

With the related art, therefore, it is extremely difficult, due to the properties of various types of vacuum control valves, to improve controllability in the low flow rate region (the low conductance region) of a vacuum chamber that uses plasma.

The present invention has been designed to solve the conventional problems described above, and an object of the present invention is to provide a poppet type vacuum control valve that controls a flow of a gas through a vacuum chamber that uses plasma.

Effective implementations for solving the above problems will be described below while illustrating effects or the like where necessary.

First Implementation

A vacuum control valve connected between a vacuum chamber that generates plasma and a vacuum pump to control a vacuum pressure in the vacuum chamber in accordance with manipulation of a valve opening includes a control valve main body having a valve body flow passage connecting the vacuum chamber to the vacuum pump, and a valve seat formed in the valve body flow passage. The vacuum control valve further includes an actuator having a valve body configured to manipulate the valve opening by performing a linear motion to adjust a lift, which is a distance between the valve body and the valve seat, a linear driving unit configured to generate driving force for causing the valve body to perform the linear motion, a columnar rod configured to transmit the driving force from the linear driving unit to the valve body, a cylindrical member having a cylindrical shape that covers a sliding range of the rod, and a sliding/sealing member configured to form a seal between the valve body flow passage side and an exterior side of the valve body flow passage while allowing the cylindrical member to slide. The sliding range includes a range movable from the valve body flow passage side to the exterior side of the valve body flow passage in response to manipulation of the lift, and the cylindrical member has an outer peripheral surface, a gas adsorption amount per unit area of the outer peripheral surface being smaller than that of an outer surface of the rod.

The first implementation is a vacuum control valve connected between a vacuum chamber that generates plasma and a vacuum pump in order to control the vacuum pressure in the vacuum chamber in accordance with manipulation of the valve opening. The vacuum control valve includes the cylindrical member that covers the sliding range including the range movable from the valve body flow passage side to the exterior side of the valve body flow passage in response to manipulation of the lift. The cylindrical member has the outer peripheral surface and the gas adsorption amount per unit area of the outer peripheral surface is smaller than that of the outer surface of the rod. Therefore, gas transportation into the valve body flow passage (constituting a part of a vacuum flow passage) due to gas adsorption on the exterior side of the valve body flow passage can be suppressed.

Thus, a poppet type vacuum control valve can be applied to a vacuum chamber that generates plasma without using a metallic bellows that does not possess plasma resistance. As a result, it is possible to respond to a reduced etching gas flow rate in a vacuum chamber that generates plasma.

Hence, the vacuum control valve according to the first implementation provides a novel sealing technique in which a seal is formed by suppressing gas adsorption to the rod, and is therefore able to respond to a reduced etching gas flow rate in a vacuum chamber that generates plasma. This sealing technique is based on an entirely new concept, and marks a clear departure from the basic concept of a conventional sealing technique in which the valve body flow passage (constituting a part of the vacuum flow passage) is physically isolated from an exterior space.

This sealing technique was designed on the basis of a new problem discovered by the present inventors as a result of experiments and analysis. In an experiment conducted by the present inventors, gas leakage was confirmed during an operation of an aluminum rod subjected to anodizing processing (anodic oxidation processing), serving as an example. This leakage was believed to have occurred when the physical isolation was impaired during an operation of the rod. Through analysis, however, the present inventors found that gas adsorption to the rod may have been another chief cause. The present inventors then conducted an experiment after attaching the cylindrical member so as to cover the rod, and confirmed that in so doing, the leakage was greatly reduced. Thus, the present inventors confirmed that their analysis was correct. The vacuum control valve according to the first implementation was newly designed on the basis of these experiments and analysis.

Second Implementation

In the vacuum control valve according to the first implementation, the cylindrical member includes a sintered body having an insulating property, the sintered body being formed by sintering a non-metallic material having an insulating property through heat treatment.

According to the second implementation, the cylindrical member includes the sintered body having an insulating property, which is formed by sintering a non-metallic material having an insulating property through heat treatment. The superior insulating property ensures that superior plasma resistance is realized, while high rigidity ensures that deterioration of the sealing structure is effectively suppressed and also contributes to a reduction in surface area. The reduced surface area is realized by forming a smooth surface and suppressing an increase in surface area due to irregularities. More specifically, the present inventors discovered that an anodic oxide coating of an aluminum rod, for example, remains highly irregular even after subjected to sealing, and therefore adsorbs a large amount of gas. It was confirmed by an experiment conducted by the present inventors that a sintered body has fewer irregularities than an anodic oxide coating, making it possible to reduce the adsorption amount greatly.

Third Implementation

In the vacuum control valve according to the second implementation, the sintered body is constituted by a ceramic formed by sintering aluminum oxide.

According to the third implementation, the sintered body is formed from a ceramic formed by sintering aluminum oxide, and therefore superior structural strength and a superior insulating property can be realized in accordance with material characteristics of the sintered body.

Fourth Implementation

In the vacuum control valve according to the second or third implementation, the rod is formed from a metallic material.

Fifth Implementation

In the vacuum control valve according to the fourth implementation, the rod is made of aluminum.

Sixth Implementation

In the vacuum control valve according to the fourth or fifth implementation, the gas adsorption amount per unit area of the outer peripheral surface of the cylindrical member is smaller than that of the outer surface of the rod on which an anodic oxide coating is formed.

According to the sixth implementation, the sintered body has fewer irregularities than the anodic oxide coating, and therefore the adsorption amount can be reduced greatly.

Seventh Implementation

In the vacuum control valve according to any one of the first to sixth implementation, the cylindrical member includes a cylinder member covering the outer surface via a predetermined gap and two elastic seal members disposed separately in an operating direction of the rod. The two elastic seal members possess elasticity for sealing the predetermined gap.

According to the seventh implementation, the two elastic seal members for sealing the gap are provided between the cylinder member covering the outer surface of the rod with the predetermined gap and the rod, and therefore a difference in thermal expansion amounts occurring in the cylinder member and the rod due to variation in an environmental temperature can be absorbed by the elastic seal members. As a result, design freedom with respect to material selection for the cylinder member and the rod can be increased, and therefore a metallic material (aluminum, for example) exhibiting superior strength and ductility may be selected as the material of the rod, for example, while a sintered body of highly insulating aluminum oxide may be selected as the material of the cylinder member.

Eighth Implementation

In the vacuum control valve according to any one of the first to seventh implementation, the sliding/sealing member includes a sliding member having a sliding surface on which the cylindrical member slides, a vacuum sliding chamber, which is a space within the sliding surface that is sealed by a first sliding/sealing member and a second sliding/sealing member, and an evacuation flow passage, which is a flow passage for performing evacuation from the vacuum sliding chamber. The first sliding/sealing member forms a seal between the vacuum sliding chamber and the valve body flow passage. The second sliding/sealing member forms a seal between the vacuum sliding chamber and the exterior. And the vacuum sliding chamber includes a tubular space formed to extend from the first sliding/sealing member to the second sliding/sealing member in the operating direction of the rod.

In an actuator according to the eighth implementation, the vacuum sliding chamber that can be evacuated is formed in the sliding surface on which the cylindrical member slides, and therefore, even when the rod moves beyond the first sliding/sealing member in response to manipulation of the lift, the rod is inserted into the vacuum sliding chamber. The evacuation flow passage, which is a flow passage for performing evacuation, is connected to the vacuum sliding chamber, and therefore gas adsorption to the rod can be suppressed. Meanwhile, by providing the tubular space formed to extend from the first sliding/sealing member to the second sliding/sealing member in the operating direction of the rod as the vacuum sliding chamber, it is possible to increase an amount of manipulation applied to a lift corresponding to a reciprocating operating condition between the vacuum sliding chamber and the valve body flow passage.

Furthermore, even when the rod moves beyond the second sliding/sealing member by manipulating the lift in excess of the lift corresponding to the reciprocating operating condition between the vacuum sliding chamber and the valve body flow passage, gas transportation using the sliding surface as a relay point can be suppressed. As a result, gas transportation into the vacuum flow passage from the exterior due to gas adsorption and desorption can be suppressed.

Ninth Implementation

In the vacuum control valve according to the eighth implementation, the vacuum sliding chamber is formed in a range entirely covering a region movable from the valve body flow passage side to the exterior side of the vacuum sliding chamber in response to manipulation of the lift.

According to the ninth implementation, the vacuum sliding chamber is formed in a range entirely covering the region movable from the valve body flow passage side to the exterior side of the vacuum sliding chamber in response to manipulation of the lift, and therefore a range of the rod that is exposed to the interior of the valve body flow passage reciprocates between the vacuum sliding chamber and the valve body flow passage. As a result, the range of the rod that is exposed to the interior of the valve body flow passage is always within a range of an evacuated region, and therefore leakage due to gas adsorption can be suppressed reliably. This configuration can be realized by at least one of adjusting a size of the vacuum sliding chamber (in the operating direction of the rod) and adjusting limitation of the lift (mechanical limitation, for example).

Tenth Implementation

In the vacuum control valve according to the eighth or ninth implementation, the first sliding/sealing member includes an elastic member having a pair of lips formed to bifurcate into two prongs, and a biasing member biasing the elastic member in a direction for splaying the pair of lips.

According to the tenth implementation, the biasing member is provided to bias the elastic member in the direction for splaying the pair of lips formed to bifurcate into two prongs, and therefore, even when a pressure in a vacuum sliding region decreases due to evacuation, a surface pressure of the lips can be increased, whereby a superior sealing performance can be realized.

Eleventh Implementation

A vacuum control apparatus for controlling a vacuum control valve includes a control unit for controlling the vacuum control valve according to any one of the eighth to tenth implementation, wherein the control unit has a conductance manipulation mode in which manipulation of the lift is limited such that the region movable from the valve body flow passage side to the exterior side of the vacuum sliding chamber is within a range of the vacuum sliding chamber.

The eleventh implementation provides a vacuum control apparatus for controlling a vacuum control valve. The vacuum control apparatus includes the conductance manipulation mode in which manipulation of the lift corresponding to movement from the valve body flow passage side to the exterior side of the vacuum sliding chamber is limited, and therefore the range of exposure to the valve body flow passage is caused to reciprocate between the vacuum sliding chamber and the valve body flow passage. Thus, adsorption in the valve body flow passage or the exterior of the vacuum sliding chamber can be prevented, and as a result, a high degree of vacuum can be realized substantially without leakage.

Twelfth Implementation

In the vacuum control apparatus according to the eleventh implementation, the control unit has a desorption mode in which, prior to a start of the conductance manipulation mode, the range movable from the valve body flow passage side to the exterior side of the vacuum sliding chamber is positioned within the vacuum sliding chamber for a predetermined time set in advance.

According to the twelfth implementation, the control unit includes the desorption mode in which, prior to the start of the conductance manipulation mode, the range moved to the exterior side of the vacuum sliding chamber is positioned within the vacuum sliding chamber for the predetermined time set in advance, and therefore the conductance manipulation mode is started following the completion of desorption from a range in which gas is adsorbed. As a result, leakage occurring during an operating mode transition to the conductance manipulation mode can be prevented.

Thirteenth Implementation

In the vacuum control valve according to any one of the first to tenth implementation, the linear driving unit includes a cylinder through which a working fluid flows, a piston defining an operating chamber in the cylinder and configured to generate a load in accordance with a pressure of the working fluid in the operating chamber; and a biasing portion biasing the piston in a direction for reducing the lift, wherein the rod is a piston rod joining the valve body to the piston.

According to the thirteenth implementation, the linear driving unit is driven by the piston that generates a load in accordance with the pressure of the working fluid, and is therefore capable of generating a large driving force while remaining small and suitable for use in an explosion-proof environment. As a result, a vacuum control valve suitable for use in a semiconductor manufacturing apparatus can be realized.

Note that the present invention is not limited to a vacuum control valve and a vacuum control system, and may also be realized in the form of a vacuum control method, for example, as well as a computer program and a program medium for realizing this method.

DETAILED DESCRIPTION OF EMBODIMENTS OF THE INVENTION (Embodiments of the Present Invention)

A first specific embodiment of the present invention will be described below with reference to the drawings. This embodiment is a specific example of a novel vacuum control valve used in a semiconductor manufacturing apparatus that executes an etching process using plasma, and a control apparatus of the vacuum control valve.

(Basic Configuration of Vacuum Control Valve)

Figure 1:
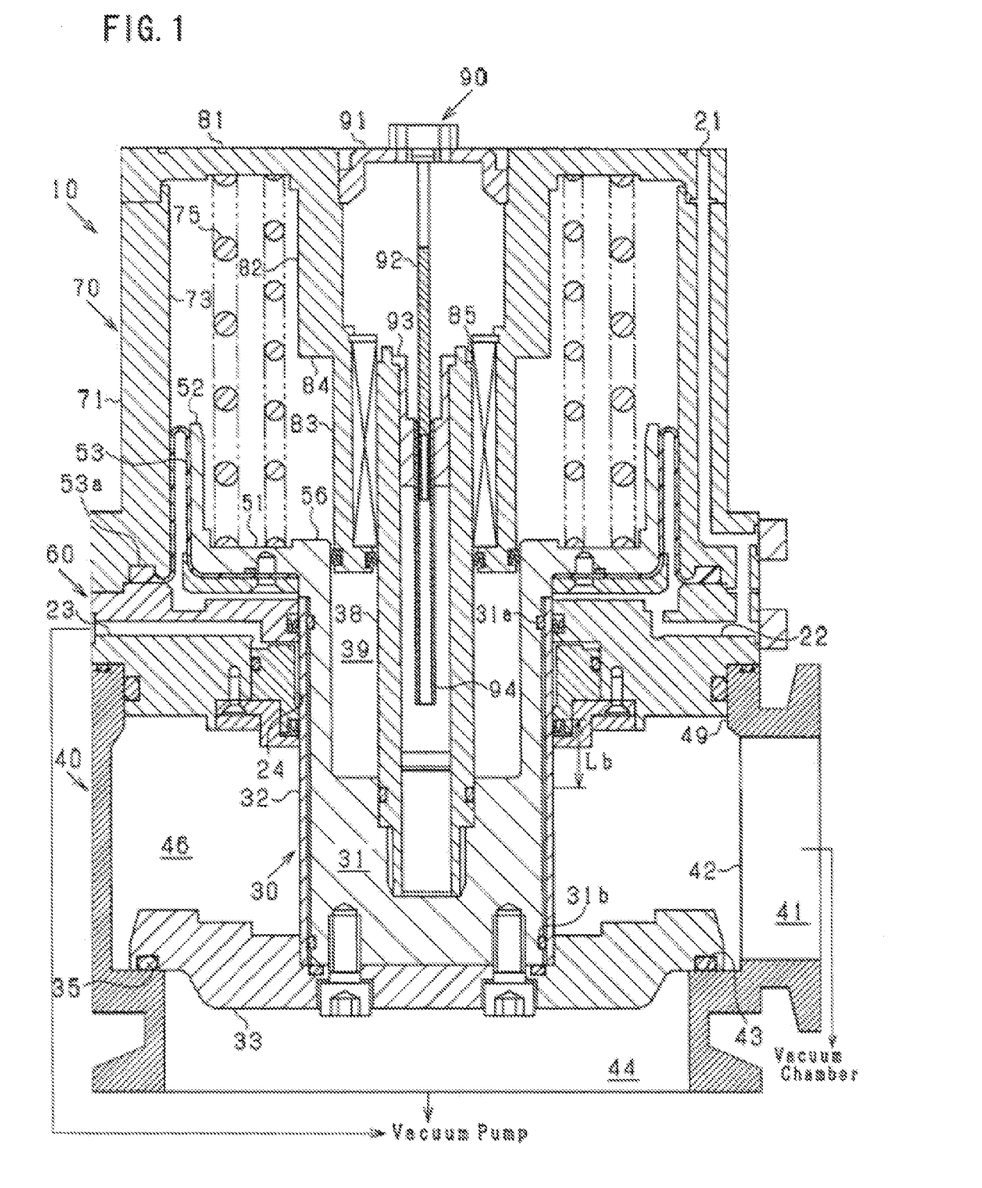
FIG. 1 is a cross-sectional view showing a configuration of a vacuum control valve 10 when non-energized (fully closed).
Figure 2:
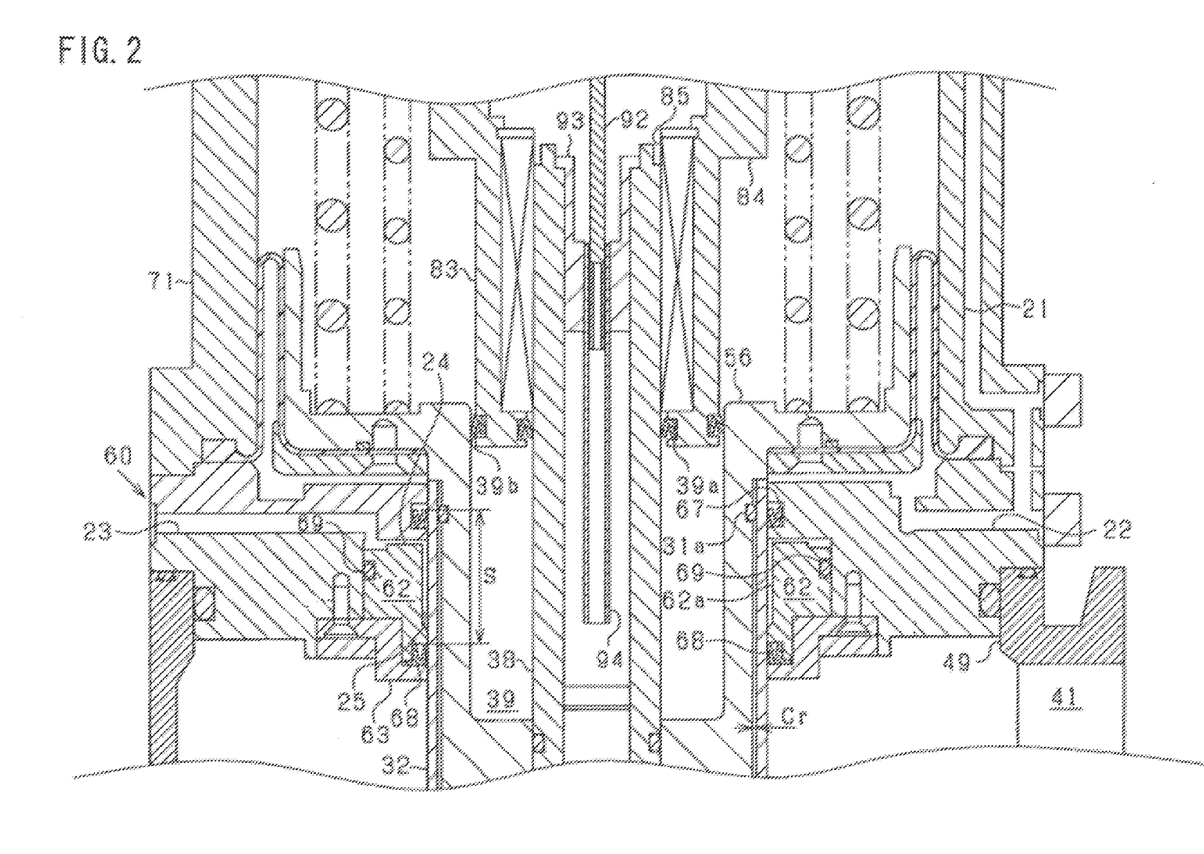
FIG. 2 is an enlarged cross-sectional view showing a configuration of a sliding member 60 of the non-energized vacuum control valve 10.
Figure 3:
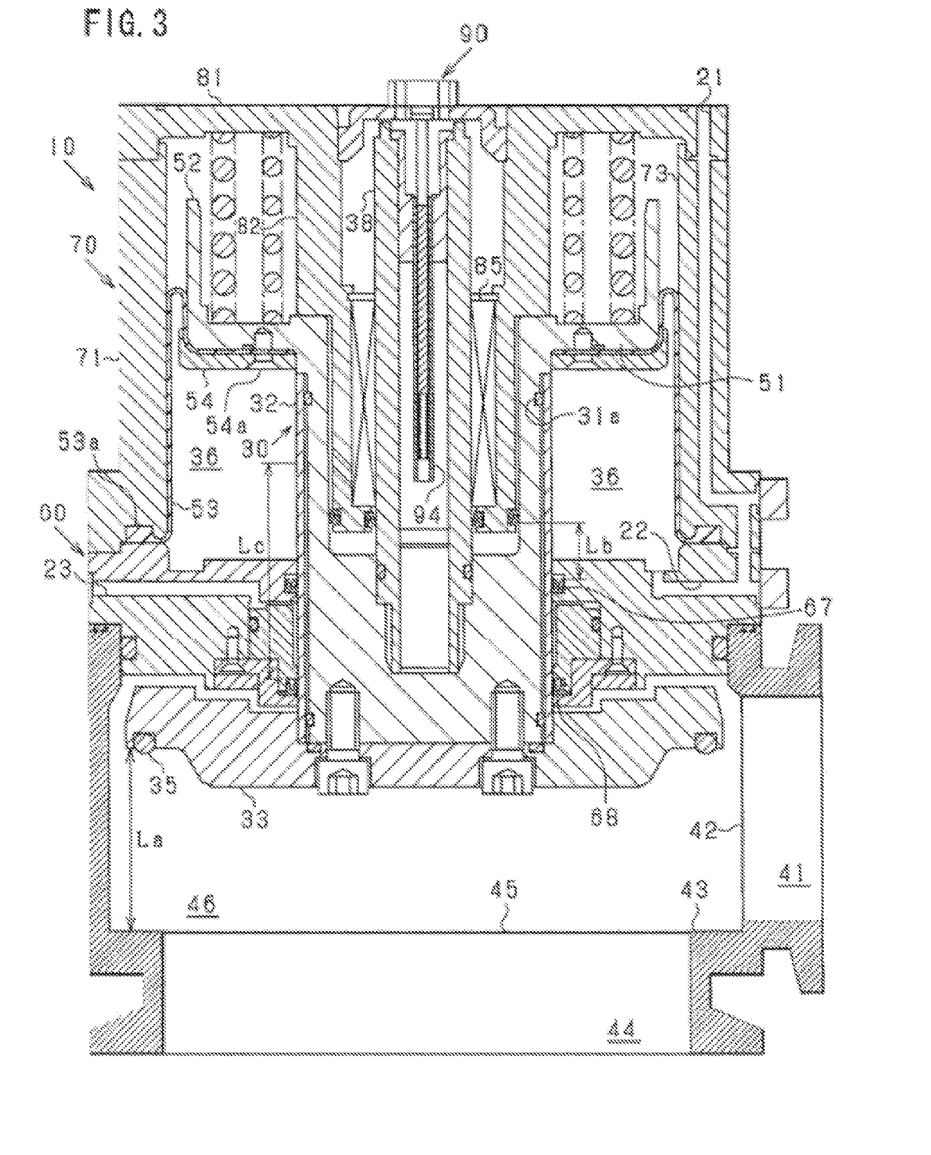
FIG. 3 is a cross-sectional view showing a configuration of the vacuum control valve 10 when fully open.

FIG. 1 is a cross-sectional view showing a configuration of a vacuum control valve 10 when non-energized (fully closed). FIG. 2 is an enlarged cross-sectional view showing a configuration of a sliding member 60 of the non-energized vacuum control valve 10. FIG. 3 is a cross-sectional view showing a configuration of the vacuum control valve 10 when fully open. The vacuum control valve 10 includes a control valve main body 40, a cylinder 70, an operating unit 30, and the sliding member 60. Note that the cylinder 70, the operating unit 30, and the sliding member 60 will also be referred to as an actuator.

The control valve main body 40 takes a cylindrical shape that extends in an operating direction (an axial direction) of the operating unit 30. A substantially columnar recessed portion having an opening 49 is formed in the control valve main body 40 on the cylinder 70 side in the axial direction. A valve body flow passage 46 is formed in the control valve main body 40 by attaching the sliding member 60 thereto so as to close the recessed portion. A primary side port 41 and a secondary side port 44 are connected to the valve body flow passage 46. A vacuum chamber that uses plasma is connected to the primary side port 41. A vacuum pump is connected to the secondary side port 44.

A primary side communication port 42 that communicates with the primary side port 41, a secondary side communication port 45 (see FIG. 3) that communicates with the secondary side port 44, and a valve seat 43 formed on a periphery of the secondary side communication port 45 are formed in the valve body flow passage 46. The sliding member 60, meanwhile, is attached to the valve body flow passage 46 in a position opposing the secondary side communication port 45. A valve body 33 provided with the operating unit 30 is disposed in the valve body flow passage 46. An O ring 35 is attached to the valve body 33 so as to project partially from the valve body 33. The valve seat 43 is formed on the periphery of the secondary side communication port 45 as an annular region that opposes the valve body 33 in the axial direction, for example, and has a lower surface roughness than other parts of the control valve body 33(i.e. as a region having a favorable surface roughness).

A cutoff function for cutting off the primary side port 41 from the secondary side port 44 and a conductance adjustment function for manipulating a conductance between the primary side port 41 and the secondary side port 44 are realized in the valve body flow passage 46. The cutoff function and the conductance adjustment function are both realized by manipulating a lift La, or in other words a distance between the valve body 33 and the valve seat 43, as a valve opening. The lift La is adjusted by moving a position of a cylindrical member 32 linearly relative to the valve seat 43.

As shown in FIG. 1, the cutoff function is realized by bringing the valve body 33 into contact with the valve seat 43 (whereby the lift La reaches zero) in the interior of the valve body flow passage 46 such that the secondary side port 44 is isolated from the valve body flow passage 46. In the cutoff condition, a seal is formed by bringing the O ring 35 attached to the valve body 33 into contact with the valve seat 43 and crushing the O ring 35. The conductance adjustment function, meanwhile, is realized by adjusting the lift La (see FIG. 3), or in other words the distance between the valve body 33 and the valve seat 43, as the valve opening. The conductance is the flowability of a gas through the flow passage.

The operating unit 30 includes the valve body 33, a piston rod 31 connected to the valve body 33, and a piston 51 connected to the opposite end portion of the piston rod 31 with respect to the valve body 33. The valve body 33 is driven by the piston 51 via the piston rod 31. An outer peripheral surface of the piston rod 31 is covered by the cylindrical member 32. The cylindrical member 32 will be described in detail below. Note that the piston rod 31 will also be referred to simply as a rod.

The piston 51 has an annular shape that extends in a radial direction toward an inner peripheral surface 73 of a cylinder tube 71, and forms an enclosed valve opening manipulation chamber 36 (see FIG. 3) on the inner peripheral surface 73 of the cylinder tube 71. A tubular member 52 having a cylindrical shape that extends toward an opposite side to the valve opening manipulation chamber 36 in the axial direction is connected to an outer peripheral end portion of the piston 51. A bellofram 53 that tightly seals the valve opening manipulation chamber 36 is connected to the piston 51 by a bellofram retainer 54. The bellofram retainer 54 is fastened to the piston 51 by screws 54*a*. Note that the valve opening manipulation chamber 36 will also be referred to as an operation chamber.

The valve opening manipulation chamber 36 is formed as a donut-shaped variable-volume sealed space surrounded by the bellofram 53, the sliding member 60, the cylindrical member 32, and the piston 51 (the bellofram retainer 54). An outer peripheral end portion 53*a* of the bellofram 53 is sandwiched between the cylinder tube 71 and the sliding member 60. As a result, airtight seals are realized between the bellofram 53 and the sliding member 60 and between the bellofram 53 and the cylinder tube 71. The valve opening manipulation chamber 36 is formed by employing the bellofram 53 to define an interior space formed by the inner peripheral surface 73. Working air can be supplied to the valve opening manipulation chamber 36 through a valve opening air flow passage 21 and a connecting flow passage 22.

The piston 51 is biased by a biasing spring 75. The biasing spring 75 applies a biasing force to the piston 51 of the operating unit 30 in a direction for reducing both the lift La and the volume of the valve opening manipulation chamber 36. The biasing spring 75 is housed in a space surrounded by the inner peripheral surface 73 of the cylinder tube 71 and an annular head cover 81. One end of the biasing spring 75 contacts the piston 51 on an opposite side to the valve opening manipulation chamber 36 in the axial direction (i.e. a rear side). The other end of the biasing spring 75 contacts the head cover 81.

The head cover 81 includes a tubular portion 82 having a cylindrical outer periphery, and a sliding projection portion 83 having a cylindrical outer periphery with a smaller diameter than the tubular portion 82. The tubular portion 82 and the sliding projection portion 83 of the head cover 81 have a common central axis. The stroke limitation surface 84 is a contact surface that limits an ascension amount of the piston 51 by contacting a stroke limitation end portion 56 formed on the piston 51. As a result, a stroke of the piston 51 is limited in an ascending direction (a lift La increasing direction) by the stroke limitation surface 84, and limited in a descending direction (a lift La decreasing direction) by the valve seat 43.

The sliding projection portion 83 is housed in a cutoff load generating chamber 39 formed in the interior of the piston rod 31. The cutoff load generating chamber 39 is formed on an inner side of the valve opening manipulation chamber 36. The cutoff load generating chamber 39 is sealed by V-shaped packing 39*a* and 39*b* (see FIG. 2) attached to the sliding projection portion 83. A cutoff load generated in the cutoff load generating chamber 39 can also be used to improve a manufacturability of the vacuum control valve 10 by lightening a set load (a cutoff load) of the biasing spring 75 during manufacture so that manufacture can be performed more easily.

The piston rod 31 is attached to an inner side of the sliding projection portion 83 via a linear bearing 85 and a guide rod 38 to be capable of sliding. The linear bearing 85 enables the operating unit 30 to move smoothly while maintaining accurate positional relationships between the operating unit 30, the cylinder 70, and the sliding member 60 in a perpendicular direction to the axis.

A valve body position sensor 90 is attached to the vacuum control valve 10. The valve body position sensor 90 includes a probe 92 attached to the head cover 81 via a probe attachment member 91, and an insertion pipe 94 attached to the piston rod 31 via the guide rod 38 and an insertion pipe attachment member 93. The valve body position sensor 90 is capable of generating an electric signal that corresponds to an insertion length by which the probe 92 is inserted into the insertion pipe 94. An operation amount of the piston rod 31 relative to the head cover 81 can be measured as a variation amount in the insertion length, and therefore the lift La can be measured in accordance with the variation amount. A linear displacement sensor such as LINEAR PULSE CODER® or the like, for example, can be used as the valve body position sensor 90.

(Adsorption/Transportation Mechanism and Sealing Structure of Vacuum Control Valve)

Next, a mechanism by which a working fluid is adsorbed and transported, which has been newly discovered by the present inventors, will be described. In this embodiment, working air (air) is described as an example of a working fluid. Air contains nitrogen and oxygen as main components, and as shown in FIG. 3 (showing the valve in a fully open condition), is adsorbed (physically adsorbed and chemically adsorbed, for example) to the operating unit 30 in the interior of the valve opening manipulation chamber 36. When the valve is closed, as shown in FIG. 1, the air adsorbed to the operating unit 30 is desorbed in the interior of the valve body flow passage 46.

The operating unit 30 has a specific sliding range Lb (see FIGS. 1 and 3). The specific sliding range Lb is a region corresponding to a range in which exposure to both the valve opening manipulation chamber 36 and the valve body flow passage 46 is possible in response to manipulation of the lift La (between the fully open condition and the cutoff condition). For example, the specific sliding range Lb can be defined as a region corresponding to a range of a sliding surface of the operating unit 30 sliding on the sliding member 60 that exceeds a sliding part between V packing 67 and a sealing member 68 so as to be exposed to both the valve opening manipulation chamber 36 and the valve body flow passage 46. Note that the sealing member 68 will also be referred to as a first sliding/sealing member.

When the cylindrical member 32 is not attached, the specific sliding range Lb is a region in which adsorption in the valve opening manipulation chamber 36 and desorption in the interior of the valve body flow passage 46 are generated by a reciprocating motion of the valve body 33 between the fully open condition and the cutoff condition. The present inventors discovered that when air transportation from the valve opening manipulation chamber 36 to the valve body flow passage 46 occurs in this manner, an unanticipated reduction in a degree of vacuum (i.e. a pressure increase) occurs.

A metallic bellows (not shown) that prevents leakage from a sliding member of the operating unit 30 is used conventionally in the sliding member, and therefore a leakage mechanism has not been investigated sufficiently. The present inventors removed the metallic bellows, which is not plasma-resistant, and performed experiments and analysis relating to leakage from the sliding member. In these experiments, an anodized piston rod having an identical outer diameter to the cylindrical member 32 was used. The cylindrical member 32 was not attached to the piston rod.

First, the present inventors set the vacuum control valve in the fully open condition, and then performed evacuation using the vacuum pump with the vacuum chamber in a heated condition for the purpose of desorption. When a preset target condition (an ultra high vacuum) was reached, the present inventors cut off the vacuum control valve. The present inventors then determined whether or not a reduction in the degree of vacuum (a pressure increase) had occurred following cutoff of the vacuum control valve. As a result, the present inventors were able to confirm leakage caused by an operation of the vacuum control valve.

This leakage is typically believed to occur when physical isolation is impaired during an operation of the piston rod. As a result of the analysis, however, the present inventors found that gas adsorption to the piston rod may be another chief cause. The present inventors then conducted an experiment in which the cylindrical member 32 was manufactured in a cylindrical shape from a material that adsorbs little gas, and the piston rod was covered by the cylindrical member 32.

Next, the present inventors set the vacuum control valve in the fully open condition using the piston rod 31 covered by the low-adsorption cylindrical member 32, and then performed evacuation using the vacuum pump with the vacuum chamber in a heated condition. It was confirmed in this experiment that substantially no reduction in the degree of vacuum (substantially no pressure increase) occurred following cutoff of the vacuum control valve. As a result, the present inventors were able to confirm that when the piston rod 31 covered by the cylindrical member 32 is used, substantially no leakage occurs from the vacuum control valve even without the use of a metallic bellows.

The cylindrical member 32 is constituted by a sintered body (a ceramic) formed by sintering aluminum oxide (alumina) through heat treatment. The cylindrical member 32 exhibits a superior insulating property as a sintered body, and is therefore also plasma-resistant. The low adsorption property of the cylindrical member 32 is realized by making a surface of the cylindrical member 32 smooth, thereby suppressing an increase in surface area caused by irregularities. More specifically, the present inventors found that an anodic oxide coating of an aluminum rod, for example, remains highly irregular even after subjected to sealing, and therefore adsorbs a large amount of working fluid.

It was confirmed by the experiment conducted by the present inventors that the adsorption amount of the sintered body constituting the cylindrical member 32 was far smaller than that of an anodic oxide coating. When a ceramic made from dense alumina having a relative density of at least 95% was used as the sintered body constituting the cylindrical member 32, it was confirmed that the amount of leakage decreased to one hundredth or less. However, a constant effect is obtained as long as the relative density is no less than 90%, and therefore the relative density may be set even higher, for example at 96%, 97%, 98%, or 99%, in accordance with the required degree of vacuum. Moreover, the amount of leakage (the amount of gas transportation) can be minimized by using dense alumina having a high purity of at least 99%.

Furthermore, by applying a mirror finish to the surface of the dense alumina ceramic so that an average surface roughness of the dense alumina ceramic is no more than 0.2 (0.2 Ra), the adsorption property can be reduced even further, and a superior sealing property can be secured, enabling a reduction in friction between the rod and a sliding/sealing member. A reduction in friction can contribute to a low hysteresis characteristic in the vacuum control valve. The average surface roughness may be set freely at a value such as 0.1, 0.3, 0.4, or 0.5 in accordance with the specifications of the vacuum control valve 10.

The cylindrical member 32 is attached to the outer surface of the piston rod 31 with a space that forms a gap Cr (see FIG. 2). The gap Cr is sealed by O rings 31a and 31b serving as a pair of elastic seal members. The O rings 31a and 31b are disposed in the vicinity of respective end portions of the cylindrical member 32 in the operating direction of the piston rod 31.

Thus, a difference in thermal expansion amounts occurring in the cylindrical member 32 and the piston rod 31 due to variation in an environmental temperature can be absorbed by elastic deformation of the O rings 31a and 31b. As a result, an increase in freedom with respect to material selection for the cylindrical member 32 and the piston rod 31 can be obtained, and therefore a metallic material (aluminum, for example) exhibiting superior strength and ductility may be selected as the material of the piston rod 31, while a sintered body of highly insulating aluminum oxide may be selected as the material of the cylindrical member 32.

Hence, by designing a rod having a duplex structure constituted by the piston rod 31 made of a strong and ductile metallic material, the low-adsorption cylindrical member 32, and the O rings 31a and 31b, the present inventors successfully developed the poppet type vacuum control valve 10 that can be employed in a vacuum chamber using plasma. As a result, it has become possible to respond to a reduced etching gas flow rate (a very small etching gas flow rate) in a vacuum chamber that generates plasma.

This sealing technique is based on an entirely new concept, and marks a clear departure from the basic concept of a conventional sealing technique in which a vacuum flow passage is physically isolated from an exterior space. This sealing technique is based on the discovery by the present inventors of a new problem, according to which, when the metallic bellows is removed, the piston rod 31 is exposed to the exterior of the valve body flow passage 46 while performing a linear motion.

This problem was newly discovered from a configuration that runs counter to the technical common knowledge of persons skilled in the art, according to which, when a metallic bellows is not used, a rotary valve (pendulum type valve, for example) is employed. The reason for this is that with a rotary valve, it is possible to realize a simple configuration in which all movable parts are disposed within a vacuum region.

However, the present inventors did not stop there and, taking into consideration the current direction of technical advancement, or in other words the shift in demand from a medium vacuum to a high vacuum, continued their experiments in a high vacuum region.

Figure 4:
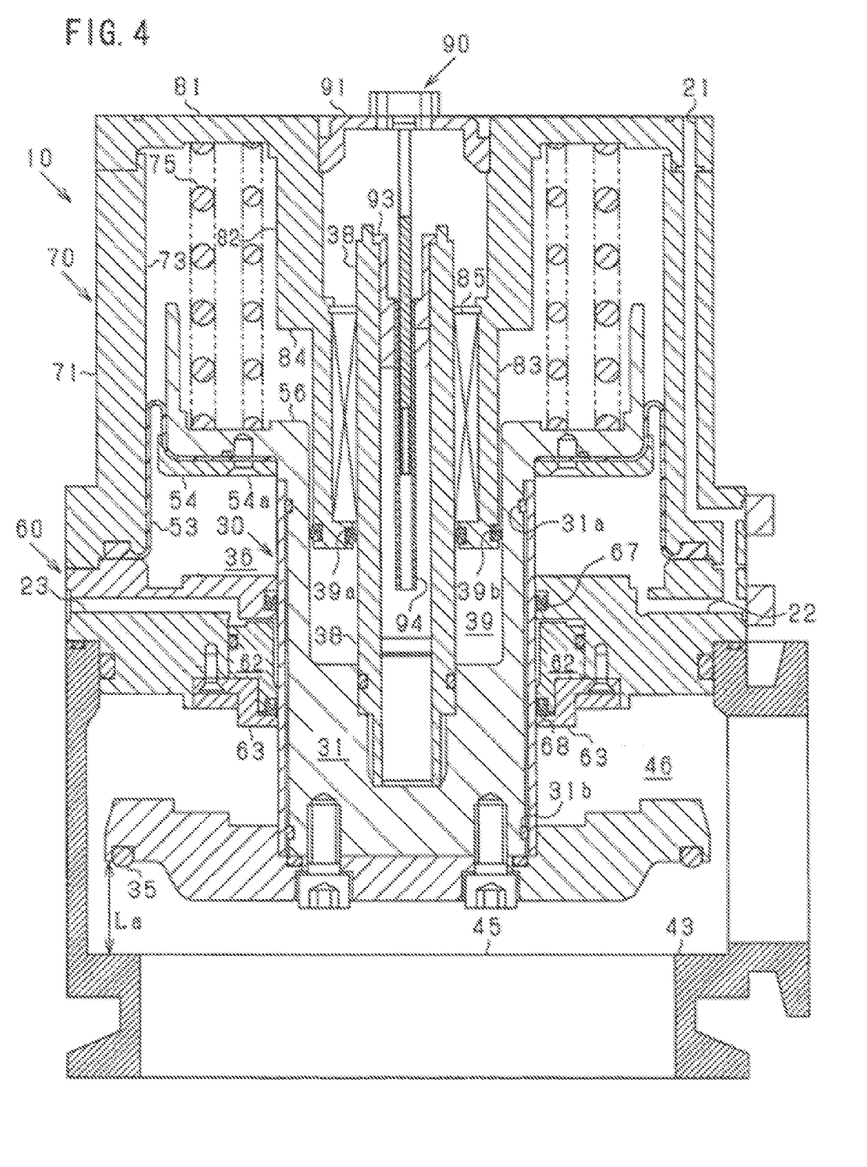
FIG. 4 is a cross-sectional view showing an operating condition of the vacuum control valve 10 during vacuum pressure control.

FIG. 4 is a cross-sectional view showing an operating condition of the vacuum control valve 10 during vacuum pressure control (conductance manipulation). In this experiment it was found that in the high vacuum region, slight leakage occurs during conductance manipulation even when the cylindrical member 32 is used. The present inventors discovered that this slight leakage is caused by working fluid adsorption in a sliding region, and designed a structure to suppress this leakage.

According to this configuration, evacuation is performed efficiently in a vacuum sliding chamber S, as shown in FIG. 2. The vacuum sliding chamber S is a region that is sealed by the sliding part between the V packing 67 and the sealing member 68, for example. This configuration of evacuation includes an evacuation region forming member 62, a support member 63, the V packing 67, the sealing member 68, an evacuation flow passage 23, a connecting flow passage 24, and a vacuum sliding flow passage 25. The evacuation region forming member 62 is a donut-shaped aluminum member disposed on a periphery of the cylindrical member 32. An annular recessed portion 62a serving as an annular recess is formed in the evacuation region forming member 62 in a position opposing the cylindrical member 32. The vacuum sliding flow passage 25 is formed between the annular recessed portion 62a and an outer peripheral surface of the cylindrical member 32.

The vacuum sliding flow passage 25 is connected to the evacuation flow passage 23 via the connecting flow passage 24. The connecting flow passage 24 is a thin cylindrical flow passage extending in the axial direction. The connecting flow passage 24 communicates with the evacuation flow passage 23 via an outer peripheral part of the connecting flow passage 24, and communicates with the vacuum sliding flow passage 25 via a bottom surface part of the connecting flow passage 24.

A sealing structure for the vacuum sliding chamber S is configured as follows. The V packing 67 seals the vacuum sliding chamber S from the valve opening manipulation chamber 36. A V-shaped part of the V packing 67 splays out upon reception of working fluid pressure from the valve opening manipulation chamber 36, leading to an increase in a sealing ability. Thus, the V packing 67 exhibits a superior sealing performance. Note that the V packing 67 will also be referred to as a second sliding/sealing member.

Figure 5:
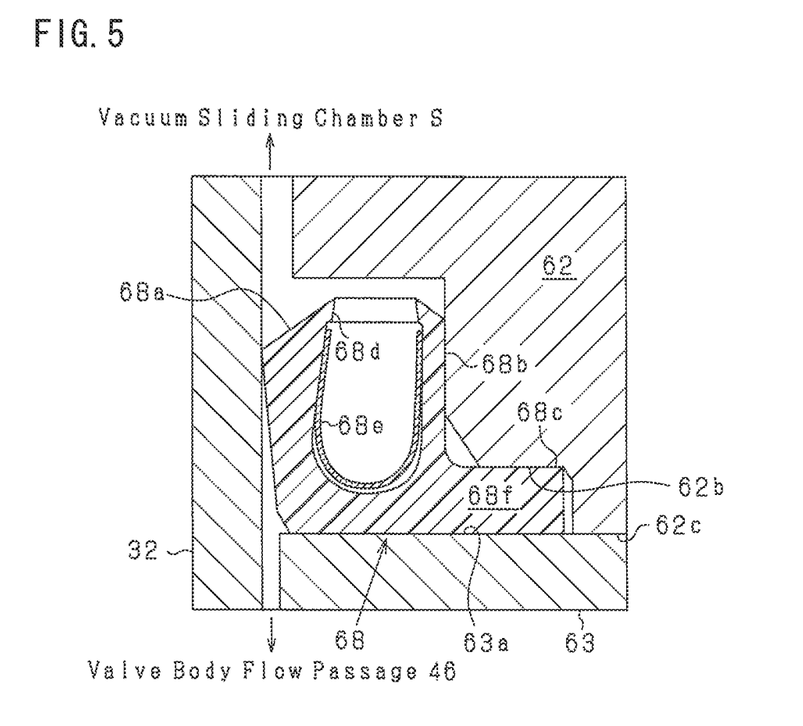
FIG. 5 is an enlarged cross-sectional view showing a friction surface between a sealing member 68 and a cylindrical member 32.

FIG. 5 is a cross-sectional view showing a configuration of the sealing member 68 according to this embodiment. The sealing member 68 seals the valve body flow passage 46, which serves as a vacuum flow passage, from the vacuum sliding chamber S. The sealing member 68 is formed using a spring-energized rotary seal such as ROTO VARISEAL®68f including a metal spring 68e. A recessed portion 68d having a U-shaped cross-section and including a pair of seal lips 68a and 68b, and a heel flange 68c are formed in the ROTO VARISEAL® 68f. The heel flange 68c is sandwiched between an inner surface 63a of the support member 63 and an inner surface 62b of the evacuation region forming member 62 and deformed by a sufficient deformation amount for the inner surface 63a to contact a contact surface 62c of the evacuation region forming member 62. Note that the sealing member 68 will also be referred to as the first sliding/sealing member.

The respective parts of the sealing member 68 function as follows. When a pressure in the vacuum sliding chamber S increases, the pair of seal lips 68a and 68b of the recessed portion 68d are splayed, enabling an increase in the sealing ability. However, the pair of seal lips 68a and 68b are biased by the metal spring 68e so as to be splayed relative to each other, and therefore the sealing member 68 is capable of realizing a superior sealing performance even when evacuation is implemented on the vacuum sliding chamber S while maintaining a seal surface pressure. Meanwhile, the heel flange 68c seals the valve body flow passage 46 serving as the vacuum flow passage from the evacuation flow passage 23 side together with an O ring 69.

With this sealing structure, even when a part of the piston rod 31 moves beyond the sealing member 68 in response to manipulation of the lift La, the part of the piston rod 31 is positioned in the vacuum sliding chamber S, and therefore gas adsorption to the piston rod 31 can be suppressed. Hence, in the vacuum sliding chamber S, the working fluid is not adsorbed to a region of the cylindrical member 32 that reciprocates between the vacuum sliding chamber S and the valve body flow passage 46, and therefore a phenomenon of working fluid transportation is suppressed. It is evident as a result that by employing this sealing structure, it is possible to handle a higher vacuum condition (a high vacuum, for example).

Furthermore, even when an operation is performed to manipulate the lift such that a part of the piston rod 31 moves beyond the V packing 67, gas transportation using the sliding surface as a relay point can be suppressed. The working fluid transportation using the sliding region as a relay point is as two-stage transportation having the vacuum sliding chamber S as a relay point.

In a first stage, the minute amount of air adsorbed to the cylindrical member 32 in the valve opening manipulation chamber 36 is desorbed in the vacuum sliding chamber S so as to accumulate in the vacuum sliding chamber S. The first stage is performed by the cylindrical member 32 in a region thereof that reciprocates between the vacuum sliding chamber S and the valve opening manipulation chamber 36 (i.e. a valve opening manipulation chamber 36 side region). In a second stage, the air adsorbed in the vacuum sliding chamber S between the V packing 67 and the sealing member 68 is desorbed in the valve body flow passage 46 (the vacuum flow passage). The second stage is performed by the cylindrical member 32 in a region thereof that reciprocates between the vacuum sliding chamber S and the valve body flow passage 46 (i.e. a valve body flow passage 46 side region).

With this sealing structure, the working fluid desorbed in the vacuum sliding chamber S during the first stage of the transportation is evacuated via the vacuum sliding flow passage 25, the connecting flow passage 24, and the evacuation flow passage 23. Therefore the desorbed working fluid does not accumulate in the vacuum sliding chamber S. As a result, gas transportation using the sliding surface as a relay point can be suppressed.

A configuration in which a flow passage is formed in the sliding part may also be observed, but this flow passage is a test flow passage leading to a leakage test port (not shown) used during setup or a suction flow passage for preventing leakage of harmful gas from the valve body flow passage 46 to the exterior. The test flow passage is used to detect leakage using helium gas. More specifically, during setup, helium gas is released in the vicinity of the leakage test port, and leakage into the sliding part is detected when the helium gas reaches the valve body flow passage 46. The suction flow passage, meanwhile, is a port through which harmful gas is suctioned.

Hence, this configuration is inherently different in application from the respective configurations described above, and therefore the shape of the vacuum sliding chamber S also differs from the respective configurations described above. The vacuum sliding chamber S includes a tubular space formed to extend in the operating direction of the piston rod 31. The vacuum sliding flow passage 25 is formed in a central part of the tubular space. The shape of the tubular space does not conform to any of the configurations described above, and therefore runs counter to the technical common knowledge of persons skilled in the art at the time of application.

Figure 6:
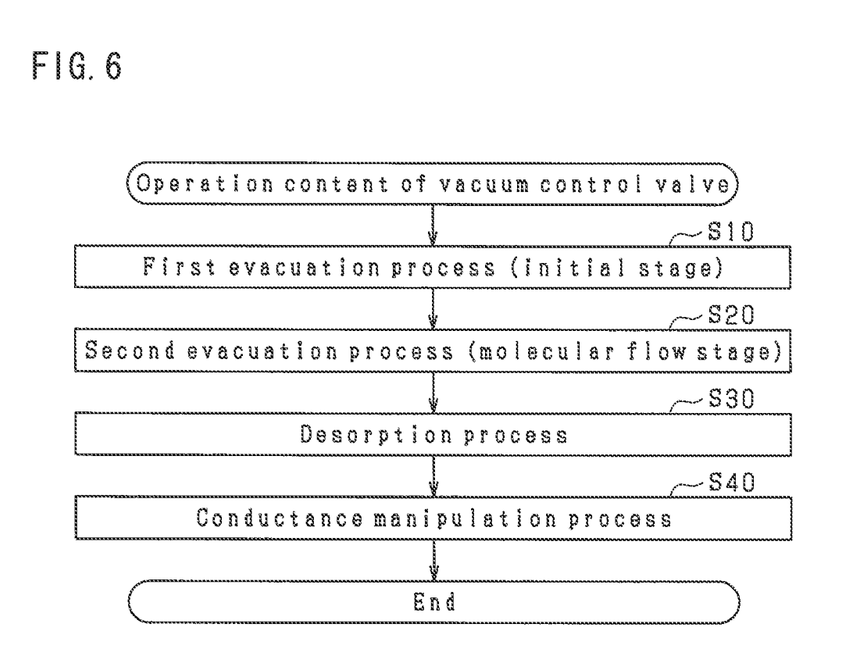
FIG. 6 is a flowchart showing an example of operational content of the vacuum control valve 10.

FIG. 6 is a flowchart showing an example of operation of the vacuum control valve 10. In step S10, a first evacuation process is executed. The first evacuation process is an initial stage of evacuation in which air is discharged slowly by manipulating the deformation amount of the O ring 35 (see FIGS. 1 and 3) (slow air discharge process). The slow air discharge process was proposed by one of the present inventors as an air discharge process performed to prevent particles from swirling up within the vacuum chamber (see Japanese Patent Application Publication No. 2000-163137).

In step S20, a second evacuation process is executed. The second evacuation process is a final stage of evacuation in which air is discharged smoothly in the fully open condition (see FIG. 3) in the form of a molecular flow serving as a stochastic flow. Air discharge in the form of a molecular flow typically takes a long time, and therefore an air discharge period is preferably shortened by increasing a product (a surface area) of the lift La and an outer peripheral length of the valve body 33.

In step S30, a desorption process is executed. The desorption process is a process for desorbing the working fluid from the specific sliding range Lb by positioning the specific sliding range Lb in the vacuum sliding chamber S and stopping the specific sliding range Lb for a predetermined time set in advance. This process is preferably executed when a higher degree of vacuum (a high vacuum, for example) is required. The stopping time is determined according to the required degree of vacuum and so on.

This process is preferred for a configuration that the specific sliding range Lb is generated by setting a stroke of the lift La to be large. Further, a heater promoting desorption may be installed in the interior of the piston rod 31 in order to shorten the stopping time.

In step S40, a conductance manipulation process is executed. The conductance manipulation process is a process for controlling the degree of vacuum in the vacuum chamber while introducing etching gas. In the conductance manipulation process, vacuum control is performed on the basis of a control law (a conductance manipulation mode) according to which the specific sliding range Lb is not exposed to the valve body flow passage 46. In so doing, a range Lc movable from the valve body flow passage 46 side past the sealing member 68 to the exterior side of the valve body flow passage 46 is shortened, and as a result, the range Lc can be kept within the range of the vacuum sliding chamber S.

If necessary, conductance manipulation can also be performed through small flow rate manipulation including contact of the O ring 35 of the valve body 33 with the valve seat 43. In so doing, seamless vacuum control can be realized in a wide pressure range from cutoff to viscous flow and molecular flow while preventing working fluid leakage into the valve body flow passage 46 serving as the vacuum flow passage.

The embodiment described in detail above has the following advantages.

(1) The vacuum control valve 10 according to this embodiment has a cutoff function, and therefore vacuum control can be realized by the single vacuum control valve 10 from an initial evacuation stage to a high vacuum region of a vacuum chamber that uses plasma.

(2) The vacuum control valve 10 is a poppet type vacuum control valve, and therefore characteristics of the vacuum control valve 10 can be used to respond to a reduced etching gas flow rate (a very small region).

(Other Embodiments)

The present invention is not limited to the embodiment described above, and may be realized as follows, for example.

(1) In the above embodiment, the present invention was described using a vacuum control valve employed in an etching vacuum chamber that uses plasma as an example, but the present invention is not limited thereto and may be used widely as a typical vacuum control valve employed in a vacuum chamber that uses plasma.

(2) In the above embodiment, the vacuum control valve generates driving force using working air, but the vacuum control valve may be driven using an electric motor. The present invention may be applied widely to inventions having a linear driving unit that causes a poppet type valve body to perform a linear motion. A control apparatus of the vacuum control valve may be realized as a control unit (a CPU, a memory, and a computer program) that controls a power supply to the electric motor or the working fluid supplied to the valve opening manipulation chamber 36 (i.e. performs electro-pneumatic control valve control).

Note that the working fluid is not limited to working air, and another type of fluid (gas or liquid) such as nitrogen gas, for example, may be used instead.

(3) In the above embodiment, the stroke limitation surface 84 formed on the head cover 81 side and the stroke limitation end portion 56 formed on the operating unit 30 side are formed in relative positions so that the specific sliding range Lb is generated. However, the stroke limitation surface 84 and the stroke limitation end portion 56 may be brought closer together so that the specific sliding range Lb is not generated, for example. Likewise in this case, the range Lc movable from the valve body flow passage 46 side past the sealing member 68 to the exterior side of the valve body flow passage 46 is shortened, and therefore the range Lc can be kept within the range of the vacuum sliding chamber S.

The former case is advantaged in that evacuation of a molecular region can be performed smoothly, while the latter case is advantaged in that working fluid leakage can be reliably prevented mechanically, and therefore a failsafe property is obtained.

Furthermore, a plurality of types of head covers having mutually different stroke limitation surface positions may be prepared so that a lift limitation range can be set freely by selecting a head cover. Alternatively, the stroke limitation surface may be adjusted manually or electrically.

(4) In the above embodiment, the cylindrical member 32 uses a ceramic formed by sintering aluminum oxide as a sintered body of a non-metallic material having an insulating property. However, aluminum nitride, aluminum titanate, boron nitride, or zirconia, for example, may be used instead. Note, however, that when aluminum oxide (alumina) is used, superior rigidity and a superior insulating property can be realized easily.

(5) In the above embodiment, the cylindrical member 32 covers the piston rod 31 substantially entirely in the operating direction of the piston rod 31, but need only cover at least the range Lc (see FIG. 3) movable from the valve body flow passage 46 side past the sealing member 68 to the exterior side of the valve body flow passage 46 in response to manipulation of the lift La. In so doing, gas transportation from the exterior of the valve body flow passage 46 (including the sliding surface) into the valve body flow passage 46 can be suppressed.

What is claimed is:

1. A vacuum control valve connected between a vacuum chamber that generates plasma and a vacuum pump to control a vacuum pressure in the vacuum chamber in accordance with manipulation of a valve opening, comprising:
    a control valve main body having a valve body flow passage connecting the vacuum chamber to the vacuum pump, and a valve seat formed in the valve body flow passage; and
    an actuator,
    the actuator comprising:
        a valve body configured to manipulate the valve opening by performing a linear motion to adjust a lift, which is a distance between the valve body and the valve seat;
        a linear driving unit configured to generate driving force for causing the valve body to perform the linear motion;
        a columnar rod configured to transmit the driving force from the linear driving unit to the valve body;
        a cylindrical member having a cylindrical shape that covers a sliding range of the rod; and
        a sliding/sealing member configured to form a seal between the valve body flow passage side and an exterior side of the valve body flow passage while allowing the cylindrical member to slide,
    wherein the sliding range includes a range movable from the valve body flow passage side to the exterior side of the valve body flow passage in response to manipulation of the lift, and
    the cylindrical member has an outer peripheral surface, a gas adsorption amount per unit area of the outer peripheral surface being smaller than that of an outer surface of the rod.

2. The vacuum control valve according to claim 1, wherein the cylindrical member includes a sintered body having an insulating property, the sintered body being formed by sintering a non-metallic material having an insulating property through heat treatment.

3. The vacuum control valve according to claim 2, wherein the sintered body is constituted by a ceramic formed by sintering aluminum oxide.

4. The vacuum control valve according to claim 2, wherein the rod is formed from a metallic material.

5. The vacuum control valve according to claim 4, wherein the rod is made of aluminum.

6. The vacuum control valve according to claim 4, wherein the gas adsorption amount per unit area of the outer peripheral surface of the cylindrical member is smaller than that of the outer surface of the rod on which an anodic oxide coating is formed.

7. The vacuum control valve according to claim 1, wherein the cylindrical member comprises:
    a cylinder member covering the outer surface with a predetermined gap; and
    two elastic seal members disposed separately in an operating direction of the rod, the two elastic seal members possessing elasticity for sealing the predetermined gap.

8. The vacuum control valve according to claim 1, the sliding/sealing member comprising:
    a sliding member having a sliding surface on which the cylindrical member slides;
    a vacuum sliding chamber, which is a space within the sliding surface sealed by a first sliding/sealing member and a second sliding/sealing member; and
    an evacuation flow passage, which is a flow passage for performing evacuation from the vacuum sliding chamber,
    wherein the first sliding/sealing member forms a seal between the vacuum sliding chamber and the valve body flow passage,
    the second sliding/sealing member forms a seal between the vacuum sliding chamber and the exterior, and
    the vacuum sliding chamber includes a tubular space formed to extend from the first sliding/sealing member to the second sliding/sealing member in the operating direction of the rod.

9. The vacuum control valve according to claim 8, wherein the vacuum sliding chamber is formed in a range entirely covering a region of the rod movable from the valve body flow passage side to the exterior side of the vacuum sliding chamber in response to manipulation of the lift.

10. The vacuum control valve according to claim 8, wherein the first sliding/sealing member comprises:
    an elastic member having a pair of lips formed to bifurcate into two prongs; and
    a biasing member biasing the elastic member in a direction for splaying the pair of lips.

11. A vacuum control apparatus for controlling a vacuum control valve, comprising a control unit for controlling the vacuum control valve according to claim 8,
    wherein the control unit has a conductance manipulation mode in which manipulation of the lift is limited such that the region movable from the valve body flow passage side to the exterior side of the vacuum sliding chamber is within a range of the vacuum sliding chamber.

12. The vacuum control apparatus according to claim 11, wherein the control unit has a desorption mode in which, prior to a start of the conductance manipulation mode, the range movable from the valve body flow passage side to the exterior side of the vacuum sliding chamber is positioned within the vacuum sliding chamber for a predetermined time set in advance.

13. The vacuum control valve according to claim 1, the linear driving unit comprising:
    a cylinder through which a working fluid flows;
    a piston defining an operating chamber in the cylinder and configured to generate a load in accordance with a pressure of the working fluid in the operating chamber; and
    a biasing portion biasing the piston in a direction for reducing the lift, wherein the rod is a piston rod joining the valve body to the piston.

* * * * *